United States Patent [19]
Dittmar

[11] 3,945,290
[45] Mar. 23, 1976

[54] DEVICE FOR PRODUCING A VIBRATO EFFECT FOR ACCOUSTIC SIGNALS

[75] Inventor: Wilfried Dittmar, Halsenbach, Hunsruck, Germany

[73] Assignee: Wersi-electronic GmbH & Co. KG, Halsenbach, Hunsruck, Germany

[22] Filed: Feb. 20, 1975

[21] Appl. No.: 551,160

Related U.S. Application Data

[63] Continuation of Ser. No. 444,375, Feb. 21, 1974, abandoned.

[30] Foreign Application Priority Data

Feb. 24, 1973 Germany ............................ 2309293

[52] U.S. Cl. ............. 84/1.25; 84/1.24; 84/DIG. 26; 179/1 J; 333/29

[51] Int. Cl.$^2$... G10H 1/02; H03H 7/32; H04R 3/00

[58] Field of Search ..... 84/1.01, 1.24, 1.25, DIG. 4, 84/DIG. 26; 179/1 J, 1 M; 331/106, 178; 333/29

[56] References Cited

UNITED STATES PATENTS

| | | | |
|---|---|---|---|
| 2,509,923 | 5/1950 | Hanert | 84/1.25 |
| 3,258,519 | 6/1966 | Young | 84/1.25 |
| 3,260,785 | 7/1966 | Krug | 84/1.25 |
| 3,474,181 | 10/1969 | Ayres | 84/1.25 |
| 3,515,792 | 6/1970 | Deutsch | 84/1.24 X |
| 3,681,531 | 8/1972 | Burkhard et al. | 179/1 J |
| 3,749,837 | 7/1973 | Doughty | 179/1 J |
| 3,757,022 | 9/1973 | Markowitz | 84/1.25 |
| 3,763,305 | 10/1973 | Nakada et al. | 84/1.24 X |
| 3,816,637 | 6/1974 | Whitefield | 84/1.24 |
| 3,833,752 | 9/1974 | Van Der Kooij | 84/1.24 |

*Primary Examiner*—L. T. Hix
*Assistant Examiner*—Stanley J. Witkowski

[57] ABSTRACT

The invention relates to an apparatus for producing a vibrato effect in acoustic signals, particularly for electronic organs, in which the output signals are obtained by successively scanning a plurality of points of a delay line fed by the acoustic signals. The apparatus includes a scanning matrix having a field of first inputs each connected to one of the points to be scanned, a field of second inputs to each of which a scanning impulse can be successively fed by a scanning impulse generator, and a linking circuit associated with each pair of second inputs, which linking circuits, upon the occurrence of a scanning impulse at the second input, transmit the acoustic signal of the associated first input to a common output, the scanning impulse generator producing impulses of a shape in which the rising and falling flanks are in the form of transition sections extending over a predetermined period, each linking circuit comprising a control stage which is controlled by the scanning impulse and influences the amplitude of the acoustic signal fed to the output. The individual points of the delay line are scanned electronically by means of the scanning matrix. The scanning impulses not only serve to select the desired point but also for gradually blending in and out the acoustic signal at the selected point. Consequently, one obtains a complex vibrato which is pleasant to listen to, without superpositioning background noise caused by the switching frequency.

14 Claims, 4 Drawing Figures

DEVICE FOR PRODUCING A VIBRATO EFFECT FOR ACCOUSTIC SIGNALS

This application is a continuation of application Ser. No. 444,375, filed Feb. 21, 1974, and now abandoned.

The invention relates to an apparatus for producing a vibrato effect in acoustic signals, particularly for electronic organs, in which the output signals are obtained by successively scanning a plurality of points of a delay line fed by the acoustic signals.

If an acoustic signal passes through the delay line, it changes its amplitude and phase position. This change depends on the frequency of the acoustic signal. If, now, different points of the delay line are scanned periodically then, by reason of the multiplicity of reflections, resonances and transit time displacements that are possible in such a delay line, a complex vibrato will be produced in which amplitude, frequency and phase changes are influential. This apparatus has an effect similar to that of a mechanical vibrato of the kind that can be produced by rotating loudspeakers or rotating sound-diverting baffles but will be effective with a much lower volume, weight and power consumption.

In a known apparatus of this kind the individual points of the delay line are successively scanned with the aid of a rotary condenser. For this purpose the points to be scanned are each connected with a fixed condenser segment while the output is connected to a continuously rotatable condenser plate. Here, too, one requires a mechanical drive of which the rotary speed is variable to change the tremolo.

The invention aims to provide an apparatus of the aforementioned kind in which the complex vibrato effect can be produced without mechanically moved components.

According to the invention, the apparatus comprises a scanning matrix having a field of first inputs each connected to one of the points to be scanned, a field of second inputs to each of which a scanning impulse can be successively fed by a scanning impulse generator, and a linking circuit associated with each pair of second inputs, which linking circuits, upon the occurrence of a scanning impulse at the second input, transmit the acoustic signal of the associated first input to a common output, the scanning impulse generator producing impulses of a shape in which the rising and falling flanks are in the form of transition sections extending over a predetermined period, each linking circuit comprising a control stage which is controlled by the scanning impulse and influences the amplitude of the acoustic signal fed to the output.

In this apparatus the individual points of the delay line are scanned electronically by means of the scanning matrix. The scanning impulses not only serve to select the desired point but also for gradually blending in and out the acoustic signal at the selected point. Consequently, one obtains a complex vibrato which is pleasant to listen to, without superpositioning background noise caused by the switching frequency.

It is a particular advantage if the scanning impulse generator produces impulses in which the successive impulses of adjacent outputs overlap. This will mean that while the acoustic signal derived from one point is blended out, the acoustic signal occurring at the next point is blended in. By appropriately shaping and overlapping the scanning impulses one obtains a transition of the individual scanning operations and this will appear to be continuous to the ear.

In a preferred embodiment, each control stage comprises a diverting control transistor which, by means of the transition sections of a scanning impulse, is gradually brought from the conductive to the blocking state and back again, and an amplifier stage leading to the common output is branched from that side of the transistor which is adjacent to the first input. While no scanning impulse is present, the acoustic signal occurring at the respective point of the delay line is diverted past the amplifier stage. However, as soon as the transistor is gradually brought to the blocking state by the scanning signal, the voltage at the input of the amplifier stage increases so that the amplitude of the acoustic signal fed to the output increases accordingly.

It is of particular advantage if a field effect transistor is used as the diverting control transistor. This, inter alia, has a high input resistance so that there will be a good separation between scanning impulses and acoustic signals.

Good results will be obtained if in each linking circuit a signal proportional to the outgoing acoustic signal is returned to the control input of the control stage. In this way non-linearities in the control stage will be balanced out. There will be linear dependence on the instantaneous value of the scanning voltage and on the damping factor. The non-linear distortions are reduced to a minimum.

Such recycling is recommended particularly when using a field effect transistor which has an inherent non-linear characteristic. In a preferred embodiment the amplifier stage comprises a transistor which, through an emitter resistance, is connected to the same power supply lines as is one of the terminals of the drain-source path of the field effect transistor, and the emitter of which is connected, through a return resistance, to the field effect transistor gate connected to receive the scanning pulse through a preliminary resistance.

As a development of the invention, the scanning impulse generator comprises an impulse forming portion in which stepped curves corresponding to the scanning impulses are composed of successive square wave impulses of different sizes. Scanning impulses of any desired shape can be very accurately obtained with a large number of square wave impulses. However, a small number of square wave impulses per scanning impulse, for example three square wave impulses, will suffice if the impulse forming portion comprises a smoothing circuit with the aid of which the flanks of the stepped waves can be smoothed out.

It is of particular advantage if the square wave impulses are derivable from the outputs of an electronic counter of which the input is fed by a cycle generator.

The cycle generator may comprise setting elements for manually or automatically setting the cycle frequency. The larger the cycle frequency, the more rapidly will the points of the delay line be scanned. A starting effect, similar to that obtained by a rotating loudspeaker which is switched from a low speed to a high speed, is obtained if the cycle frequency is changed automatically, for example with the aid of a charging or discharging condenser.

In many cases it is preferred to apply an auxiliary voltage higher than the output voltage of the electronic counter to the unidirectionally conductive outputs of the electronic counter through a respective load resistance. In this way the auxiliary voltage will normally be applied to the outputs and this will be superposed in the negative sense by the scanning impulses. This enables even control stages having a comparatively high control voltage to be brought to the fully conductive state. The electronic counter may have a larger number of outputs than the impulse forming portion and a resistance matrix may be provided in which resistances connected unilaterally to a counter output are associated in groups to the outputs of the impulse forming portion. If the counter outputs become conductive successively, one obtains differently large square wave signals which depend on the size of the resistances and which lead to a scanning signal through the group arrangement.

It is of particular advantage if the resistance groups are associated with the outputs of the impulse forming portion in such a way that, during passage of the counter, the output terminals of the impulse forming portion energized successively in a forward and backward sequence. With a minimum number of points to be scanned, this will result in continuous transitions even at the extreme locations so that the effect of rotating loudspeaker or a rotating sound deflecting baffle is achievable with a minimum of equipment.

In a further form of the invention, the tremolo apparatus is associated with switches by means of which individual parts of the organ (upper manual, lower manual, pedal) are selectively switchable through them or directly to the organ output.

Examples of the invention will now be described with reference to the accompanying drawings, wherein:-

Figure 1:
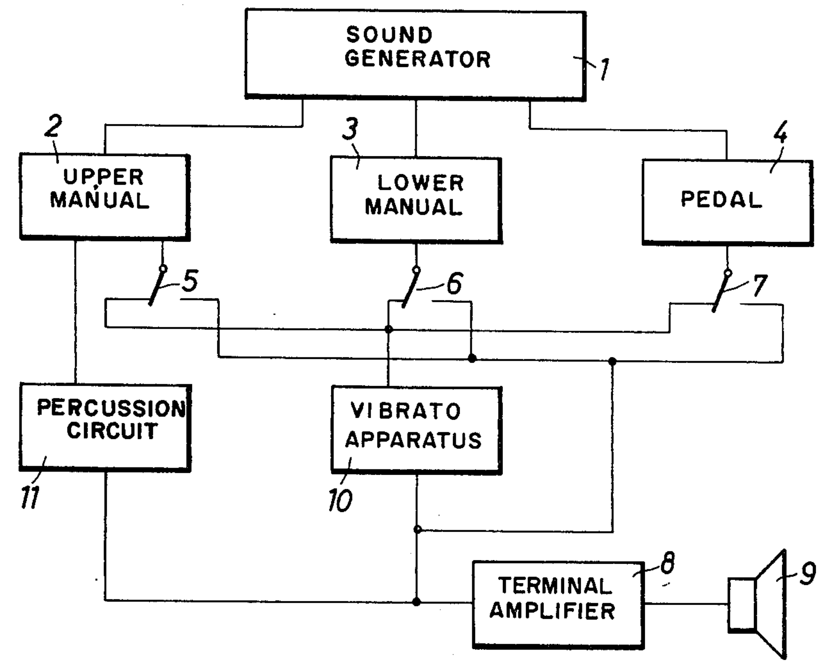
FIG. 1 is a block diagram in simplified form of an electronic organ equipped with the tremolo apparatus of the invention.

The organ diagrammatically illustrated in FIG. 1 comprises a sound generator 1 producing 96 individual tones. These are available at the upper manual 2, the lower manual 3 and the pedal manual 4. The organ components 2 to 4 are associated with switches 5, 6 and 7 by means of which the tones can be fed directly to the terminal amplifier 8 and the loudspeaker 9 or through the vibrato apparatus 10 of the invention. For example, it is possible to have the lower manual 3 working through the tremolo apparatus 10 while the upper manual 2 and the pedal 4 act directly on the terminal amplifier 8. In addition, special effects can be fed to the terminal amplifier 8 by an organ component, in the present case a percussion circuit 11.

Figure 2:
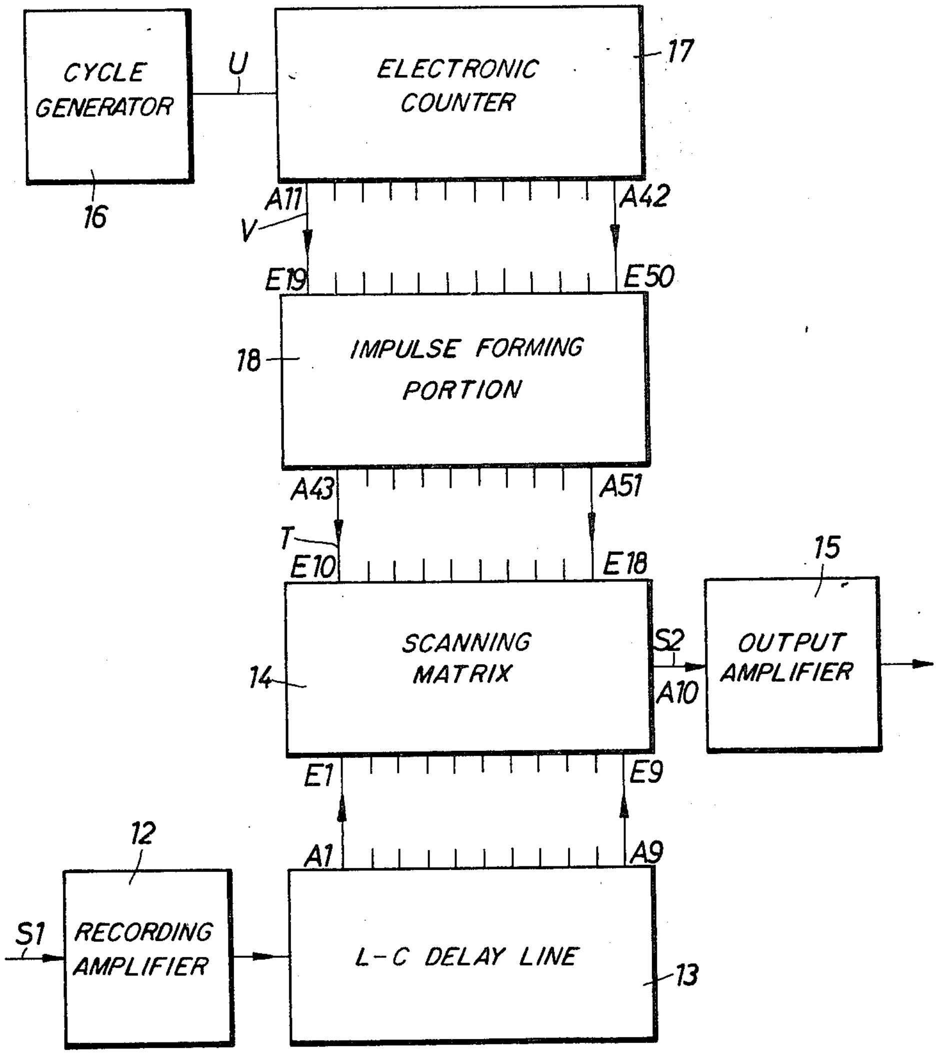
FIG. 2 is a block diagram of the vibrato apparatus.

FIG. 2 is a block diagram of the vibrato apparatus 10. A sound signal S1 is fed through an amplifier 12 to an L-C delay line 13. This has nine outputs A1-A9 at which respectively different sound signals are available in a predetermined period. Each of these outputs is connected to a first input E1-E9 of a scanning matrix 14 to which scanning signals T can be fed through nine second inputs E10-E18. A sound signal S2 having a vibrato effect can be derived from a common output A10 through an output amplifier 15.

To form the scanning impulses T there is a cycle generator 16 of which the cycle frequency can be set manually or automatically. It gives cycle impulses U to an electronic counter 17 having 32 outputs A11-A42 at which square wave impulses V will appear successively. After each passage, the counter 17 starts counting afresh. The counter outputs are connected to 32 inputs E19-E50 of an impulse forming portion 18 in which, by appropriately combining square wave voltages of different sizes and subsequently smoothing the flanks, the scanning signals T will appear successively and partially overlapping at the nine outputs A43-A51.

Figure 3:
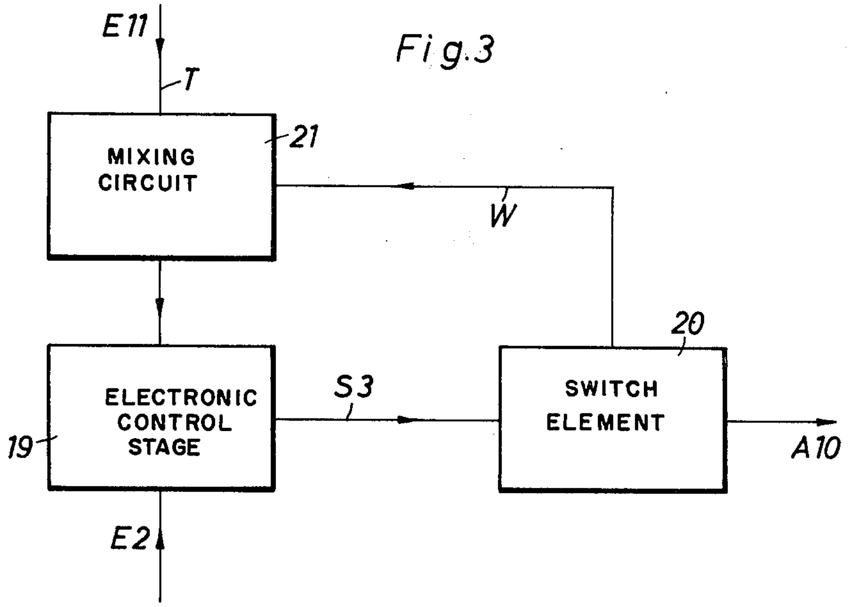
FIG. 3 is a block diagram of a combining circuit.
Figure 4:
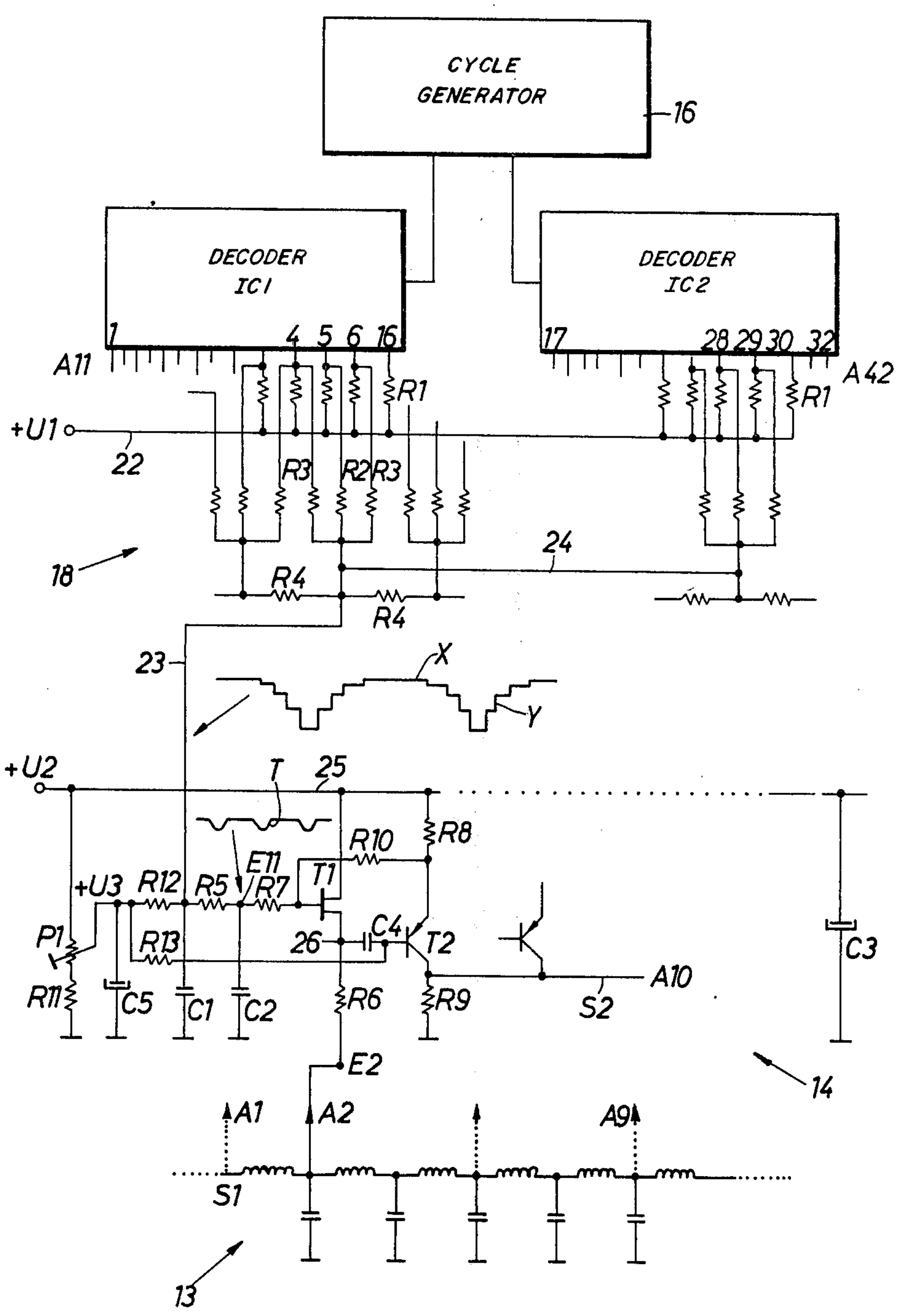
FIG. 4 is a fragmentary circuit diagram of the vibrato apparatus.

FIG. 3 diagrammatically illustrates a linking circuit with which a pair of first and second inputs E2 and E11 are interlinked in the scanning matrix 14 see FIGS. 2 and 4. The linking circuit comprises an electronic control stage 19 which, when a scanning signal is present at the input E11, permits the sound signal at the input E2 to pass to the output A10. This produces a sound signal S3 of which the amplitude is governed by the instantaneous voltage of the scanning signal T. The output circuit includes a switch element 20 with which one obtains a return signal W proportional to the controlled sound signal S3. This return signal W is mixed in a mixing circuit 21 with the scanning signal T, resulting in linear operation even with non-linear elements in the control stage.

FIG. 4 first of all shows the scanning impulse generator. The cycle generator 16 feeds a counter 17 consisting of two parts. Each part consists of a conventional decoder IC1 and IC2 (for example a 4-bit-binary decoder SN74154 manufactured by Texas Instruments). The outputs A11-A42 of this counter are additionally referenced by their numerical value 1-32. Each output is connected through a load resistance R1 to a collecting line 22 which is fed with an auxiliary voltage +U1 which is larger than the normal output voltage of the counter 17. Further, the outputs are connected to groups of three resistances R2, R3 and R3 the first and third of which are of identical value. Each group has a common output line 23. These output lines are also connected to adjacent groups through transverse resistances R4. If negative individual impulses are successively available at the outputs of the counter 17, there is obtained in the line 23 a signal X of which the stepped wave Y corresponds to the scanning signal. With the aid of the screening condensers C1 and C2 as well as the resistance R5 the flanks of the stepped wave Y are smoothed out so that the desired scanning signal T will be obtained at the control input E11 of the linking circuit of the scanning matrix 14.

Nine such lines 23 are provided in the scanning matrix, each leading to one of the inputs E10-E18. A scanning impulse is successively obtained at each of these, the impulses overlapping to a larger or smaller extent. As indicated by the connecting line 24, the input E11 is fed by two groups of the resistances R2 and R3. Accordingly, during passage of the counter 17 from 1 to 32, the control inputs E10-E18 can be fed with scanning impulses in this sequence and subsequently back again from E18 to E10, the inputs E11-E17 being in each case doubly tied up.

The outputs A1-A9 of the delay line 13 are connected directly to junctions between the chokes and condensers.

To serve as a control stage there is here a field effect transistor T1 of which the source is connected to a mains supply 25, the drain is connected to the input E2 through a resistance R6, and the gate is connected to the input E11 through a preliminary resistance R7. The power supply line has a supply voltage +U2 applied to it and this is stabilised by a condenser C3. The base of a transistor T2 is connected through a condenser C4 to a point 26 between the drain and resistance R6. The emitter of the transistor T2 is connected to the mains supply 25 through a resistance R8 and its collector is grounded through a resistance R9. The common output line A10 which branches from the collector is also fed by the transistors of the other linking circuits of the matrix 14. Between the emitter of the transistor T2 and the gate of the field effect transistor T1 there is a return resistance of 10. The operating point of the transistors T1 and T2 is set with the aid of a potentiometer P1 which is applied to the mains voltage U2 in series with a resistance R11. The control auxiliary voltage +U3 so derived is stabilized with a condenser C5 and passed on through preliminary resistances R12 and R13.

In the normal case a high voltage will be applied to the gate of the field effect transistor T1 which is therefore fully conductive. The sound signal at the input E2 is therefore taken off. When the voltage drops as a result of the scanning impulse T, the conductivity of the transistor T1 will drop. The voltage at the point 26 decreases and a corresponding part of the sound signal is applied to the base of the transistor T2. When the transistor T1 blocks completely, this controlled sound signal has its largest amplitude. By means of the feedback through the resistance combination R8-R10-R7, the non-linear characteristic of the field effect transistor T1 is compensated.

By appropriately selecting the shape and overlap of the scanning impulses, it is possible to produce a vibrato effect which gives the impression of a continuous transition from the sound signal of one control stage to the sound signal of an adjacent control stage. There are many ways of influencing the vibrato effect, whether by changing the cycle frequency of the generator 16 or by changes in the delay line 13.

The apparatus as described is suitable not only for producing a vibrato effect in electronic organs but also for other musical instruments having an electronic output, i.e. in all cases where sound signals are processed.

I claim:

1. Apparatus for producing vibrato effect acoustic signals, the apparatus comprising: delay means having an input to which in use said acoustic signals are supplied, and a plurality of outputs at which differently delayed output acoustic signals are developed when an acoustic signal is supplied to said input; a scanning matrix having a plurality of first inputs respectively connected to said outputs of the delay means, an equal plurality of second inputs, an output, and an equal plurality of signal coupling circuits each having a first input connected to a respective one of said first inputs of the scanning matrix, a second input connected to a respective one of said second inputs of the scanning matrix and an output connected to said output of the scanning matrix; and a scanning impulse generator having a plurality of outputs respectively connected to said second inputs of the scanning matrix and comprising signal generator means for generating pulse signals comprising individual pulses having sloping flanks, which pulse signals are successively applied to said outputs of the scanning impulse generator; each said signal coupling circuit comprising control means operative in dependence on the pulse signal applied to said second input of the signal coupling circuit to control the amplitude of the acoustic signal passed from said first input to said output of the signal coupling circuit.

2. Apparatus according to claim 1 wherein said signal generator is operative such that said pulses in said signals successively applied to adjacent said outputs of the scanning impulse generator overlap in time.

3. Apparatus according to claim 1 wherein said control means comprises a first transistor the conductivity of which is controllable by an applied said pulse and an amplifier connected between said first transistor and said output of the signal coupling circuit.

4. Apparatus according to claim 3 wherein said first transistor is a field effect transistor.

5. Apparatus according to claim 1 wherein each control means comprises a field effect transistor and a feedback path connected between the output of said control means and said second input of the signal coupling circuit to provide a feedback signal proportional to an acoustic signal supplied to said output of the signal coupling circuit.

6. Apparatus according to claim 3 wherein said amplifier comprises a second transistor.

7. Apparatus according to claim 1 wherein said signal generator means comprises means to generate a plurality of square wave signals and combining means to combine said square wave signals to form said pulse signals.

8. Apparatus according to claim 7 wherein said signal generator comprises smoothing means for smoothing said flanks.

9. Apparatus according to claim 7 wherein said signal generator comprises an oscillator for generating a cyclic signal and electronic counter means for developing said square wave signals from said cyclic signal.

10. Apparatus according to claim 9 comprising means to control the frequency of said cyclic signal.

11. Apparatus according to claim 9 wherein said electronic counter means comprises unidirectionally conductive means.

12. Apparatus according to claim 9 wherein said electronic counter means has a larger number of outputs than said combining means, and said signal generator means comprises a resistance matrix comprising resistances individually connected to said outputs of said electronic counter means and associated in groups for connection to said outputs of said combining means.

13. Apparatus according to claim 12 wherein said resistance groups are associated with said outputs of said combining means such that during a cycle of said electronic counter means said outputs of said combining means are each activated twice.

14. An electronic organ comprising: means to generate a plurality of acoustic signals; output means; manual and foot control means for controlling selection of said acoustic signals; a vibrato apparatus; and switch means selectively providing a first path for direct transmission of acoustic signals selected by said control means to said output means and a second path for transmission of acoustic signals selected by said control means to said output means via said vibrato apparatus; said tremolo apparatus comprising: delay means having an input to which in use said switch means supplies said acoustic signals selected by the control means, and a plurality of outputs at which differently delayed output acoustic signals are developed when an acoustic signal is supplied to said input; a scanning matrix having a plurality of first inputs respectively connected to said outputs of the delay means, an equal plurality of second inputs, an output, and an equal plurality of signal coupling circuits each having a first input connected to a respective one of said first inputs of the scanning matrix, a second input connected to a respective one of said second inputs of the scanning matrix and an output connected to said output of the scanning matrix; and a scanning impulse generator having a plurality of outputs respectively connected to said second inputs of the scanning matrix and comprising signal generator means for generating pulse signals comprising individual pulses having sloping flanks, which pulse signals are successively applied to said outputs of the scanning impulse generator; each said signal coupling circuit comprising control means operative in dependnce on the pulse signal applied to said second input of the signal coupling circuit to control the amplitude of the acoustic signal passed from said first input to said output of the signal coupling circuit.

* * * * *